(12) United States Patent
Herring

(10) Patent No.: US 10,264,675 B2
(45) Date of Patent: Apr. 16, 2019

(54) DUAL CONNECTOR SYSTEM

(71) Applicant: TE CONNECTIVITY CORPORATION, Berwyn, PA (US)

(72) Inventor: Michael David Herring, Apex, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/490,252

(22) Filed: Apr. 18, 2017

(65) Prior Publication Data

US 2018/0301836 A1    Oct. 18, 2018

(51) Int. Cl.
| | | |
|---|---|---|
| H01R 12/70 | (2011.01) | |
| H01R 12/72 | (2011.01) | |
| H05K 1/11 | (2006.01) | |
| H05K 1/14 | (2006.01) | |
| H01R 12/71 | (2011.01) | |
| H01R 13/633 | (2006.01) | |
| H01R 13/627 | (2006.01) | |

(52) U.S. Cl.
CPC ......... H05K 1/117 (2013.01); H01R 12/7005 (2013.01); H01R 12/714 (2013.01); H05K 1/141 (2013.01); *H01R 12/718* (2013.01); *H01R 13/6275* (2013.01); *H01R 13/6335* (2013.01); *H05K 2201/049* (2013.01); *H05K 2201/10121* (2013.01); *H05K 2201/10189* (2013.01)

(58) Field of Classification Search
CPC .... G01R 12/73; H01R 12/7005; H01R 12/72; H01R 12/732; H01R 12/714; H05K 1/117; H05K 1/141

USPC .......................................... 439/74, 638, 653
See application file for complete search history.

(56) References Cited

U.S. PATENT DOCUMENTS

| | | | |
|---|---|---|---|
| 3,479,634 A | 11/1969 | Pritulsky | |
| 4,678,252 A | 7/1987 | Moore | |
| 5,242,312 A * | 9/1993 | Tondreault | H01R 12/7005 439/328 |
| 5,260,854 A | 11/1993 | Hileman et al. | |
| 5,324,204 A | 6/1994 | Lwee | |
| 5,643,001 A | 7/1997 | Kaufman et al. | |
| 6,394,817 B1 | 5/2002 | Klhira et al. | |
| 7,018,222 B2 | 3/2006 | Chang | |
| 7,074,090 B2 | 7/2006 | Ho et al. | |

(Continued)

OTHER PUBLICATIONS

U.S. Appl. No. 15/492,070, filed Apr. 20, 2017 (35 pages).

(Continued)

*Primary Examiner* — Anthony R Jimenez
*Assistant Examiner* — Paul D Baillargeon

(57) ABSTRACT

A dual connector system includes a host circuit board, a first electrical connector at a front mounting area of the host circuit board, and a second electrical connector at a rear mounting area of the host circuit board. The first electrical connector has a housing having a card slot for a module circuit board and the second electrical connector has a housing having an upper mating surface for the module circuit board. The housing has towers having ledges defining a gap between the upper mating surface and the ledges. The housing has biasing members at each tower facing the gap configured to engage the module circuit board to locate the module circuit board between the towers. The housing holds second contacts at the upper mating surface.

20 Claims, 5 Drawing Sheets

(56) References Cited

U.S. PATENT DOCUMENTS

| | | |
|---|---|---|
| 7,101,222 B2 | 9/2006 | Ho et al. |
| 7,300,298 B2 | 11/2007 | Kameda |
| 7,344,402 B2 | 3/2008 | Langgood et al. |
| 7,467,963 B2 | 12/2008 | Chen |
| 7,470,136 B2 | 12/2008 | Yahiro et al. |
| 7,510,414 B2 | 3/2009 | Yu et al. |
| 7,909,644 B1 | 3/2011 | Li et al. |
| 7,987,584 B2 | 8/2011 | Barna et al. |
| 8,113,883 B2 | 2/2012 | Chen et al. |
| 8,544,831 B2 | 10/2013 | Klein et al. |
| 8,588,561 B2 | 11/2013 | Zbinden et al. |
| 8,764,457 B2 | 7/2014 | Chen et al. |
| 8,787,711 B2 * | 7/2014 | Zbinden ............... G02B 6/4232 385/14 |
| 9,166,315 B1 | 10/2015 | Phillips et al. |
| 9,871,325 B2 | 1/2018 | Patel et al. |
| 9,972,927 B2 | 5/2018 | Nichols et al. |
| 9,991,615 B1 | 6/2018 | Herring et al. |
| 2007/0099470 A1 | 5/2007 | Yang et al. |
| 2010/0165592 A1 | 7/2010 | Takao |
| 2012/0327576 A1 | 12/2012 | Xiao et al. |
| 2014/0094063 A1 | 4/2014 | Daly |
| 2014/0111931 A1 | 4/2014 | Casserly et al. |
| 2014/0179167 A1 | 6/2014 | Long et al. |
| 2015/0318633 A1 | 11/2015 | Herring et al. |
| 2016/0134040 A1 | 5/2016 | Phillips et al. |
| 2018/0076587 A1 | 3/2018 | Herring et al. |
| 2018/0270955 A1 | 9/2018 | Herring |
| 2018/0309213 A1 | 10/2018 | Harmon et al. |

OTHER PUBLICATIONS

U.S. Appl. No. 15/723,287, filed Oct. 3, 2017 (34 pages).
TYCO Electronics "Product Specification 108-5701; DDR S.O. DIMM Socket 200 Positions" Jul. 2007 (5 pages).
TE Connectivity "Emboss Assembly DDR1 & DDR2 Sodimm Socket 200P Standard Profile Standard Type; Drawings No. C-1565917" Dec. 2001 (1 page).

* cited by examiner

DUAL CONNECTOR SYSTEM

BACKGROUND OF THE INVENTION

The subject matter herein relates generally to a dual connector system.

Dual connector systems include first and second electrical connectors mounted to a host circuit board that are electrically connected to a dual connector module. The dual connector module includes a module circuit board having connector interfaces for interfacing with the first and second electrical connectors. Typically communication components are mounted to the module circuit board. For example, electrical and/or optical components may be mounted to the module circuit board. In various applications an on-board optics module may be mounted to the module circuit board. Heat dissipation of the communication components may be provided, such as in the form of a heat sink thermally coupled to the communication components and supported by the module circuit board.

Mating of the dual connector module to the first and second electrical connectors typically involves loading the dual connector module into a first position in a vertical direction and then sliding the dual connector module to a second position in a horizontal direction to mate with the first and second electrical connectors. However, proper mating of the module circuit board to both electrical connectors simultaneously may be difficult. For example, if the module circuit board is askew in one or more directions during mating, the contacts of the electrical connectors may be damaged. If the module circuit board is misaligned relative to the first or second electrical connector, the contacts may be misaligned and improperly mated.

A need remains for a dual connector system that aligns the dual connector module with the first and second electrical connectors on the host circuit board for proper mating.

BRIEF DESCRIPTION OF THE INVENTION

In one embodiment, a dual connector system is provided including a host circuit board, a first electrical connector at a front mounting area of the host circuit board, and a second electrical connector at a rear mounting area of the host circuit board. The first electrical connector has a housing having a card slot configured to receive a front edge of a module circuit board and holding first contacts at the card slot configured to be electrically connected to contact pads at the front edge of the module circuit board. The second electrical connector has a housing having an upper mating surface configured to receive the module circuit board when mounted thereto. The housing has towers extending above the upper mating surface at opposite sides of the housing having ledges spaced apart from the upper mating surface above the upper mating surface such that a gap is defined between the upper mating surface and the ledges that receives the module circuit board. The housing has biasing members at each tower facing the gap configured to engage the module circuit board to locate the module circuit board between the towers. The housing holds second contacts at the upper mating surface configured to be electrically connected to contact pads of the module circuit board and terminated to the host circuit board.

In another embodiment, a dual connector system is provided including a host circuit board having a front mounting area and a rear mounting area, a first electrical connector at the front mounting area of the host circuit board, and a second electrical connector at the rear mounting area of the host circuit board. The first electrical connector has a housing having a card slot holding first contacts at the card slot that are terminated to the host circuit board. The second electrical connector has a housing having an upper mating surface, a first tower extending above the upper mating surface at a first side of the housing and a second tower extending above the upper mating surface at a second side of the housing. The first and second towers have ledges spaced apart from the upper mating surface above the upper mating surface such that a gap is defined between the upper mating surface and the ledges. The housing has a first biasing member at the first tower facing the gap and a second biasing member at the second tower facing the gap. The housing holds second contacts at the upper mating surface that are terminated to the host circuit board. A dual connector module is mated to the first and second electrical connectors. The dual connector module has a module circuit board including an upper surface and a lower surface facing the host circuit board. The module circuit board has at least one communication component on the upper surface. The module circuit board has first and second side edges extending between a front edge and a rear edge. The module circuit board has front contact pads proximate to the front edge for electrically connecting to the first electrical connector and rear contact pads remote from the front edge for electrically connecting to the second electrical connector. The module circuit board is received in the gap between the upper mating surface and the ledges such that the first and second sides engage the first and second biasing members, respectively. The first and second biasing members position the module circuit board between the first and second towers.

In a further embodiment, a dual connector system is provided including a host circuit board having a front mounting area and a rear mounting area, a first electrical connector at the front mounting area of the host circuit board, and a second electrical connector at the rear mounting area of the host circuit board. The first electrical connector has a housing having a card slot holding first contacts at the card slot that are terminated to the host circuit board. The second electrical connector has a housing having an upper mating surface, a first tower extending above the upper mating surface at a first side of the housing and a second tower extending above the upper mating surface at a second side of the housing. The first and second towers have ledges spaced apart from the upper mating surface above the upper mating surface such that a gap is defined between the upper mating surface and the ledges. The housing has first and second biasing members at the first and second towers, respectively, facing the gap. The housing holds second contacts at the upper mating surface that are terminated to the host circuit board. A dual connector module is mated to the first and second electrical connectors. The dual connector module has a module circuit board including an upper surface and a lower surface facing the host circuit board. The module circuit board has at least one communication component on the upper surface. The module circuit board has first and second side edges extending between a front edge and a rear edge. The module circuit board has front contact pads proximate to the front edge defining a first connector interface for electrically connecting to the first electrical connector and rear contact pads on the lower surface remote from the front edge defining a second connector interface for electrically connecting to the second electrical connector. The dual connector module is coupled to the host circuit board by lowering the dual connector module in a loading direction generally perpendicular to the host circuit board to a pre-staged position where the first connector interface is adjacent to the first electrical connector and the second connector interface is adjacent to the second electrical connector. The dual connector module is slid forward from the pre-staged position to a mated position in a mating direction generally parallel to the upper surface of the host circuit board to mate the first connector interface to the first electrical connector by loading the front edge of the module circuit board into the card slot of the first electrical connector to mate the first contacts to the first contact pads and to mate the second connector interface to the second electrical connector to mate the second contacts to the second contact pads. The module circuit board is received in the gap between the upper mating surface and the ledges in the mated position such that the first and second sides engage the first and second biasing members, respectively. The first and second biasing members position the module circuit board between the first and second towers.

DETAILED DESCRIPTION OF THE INVENTION

Figure 1:
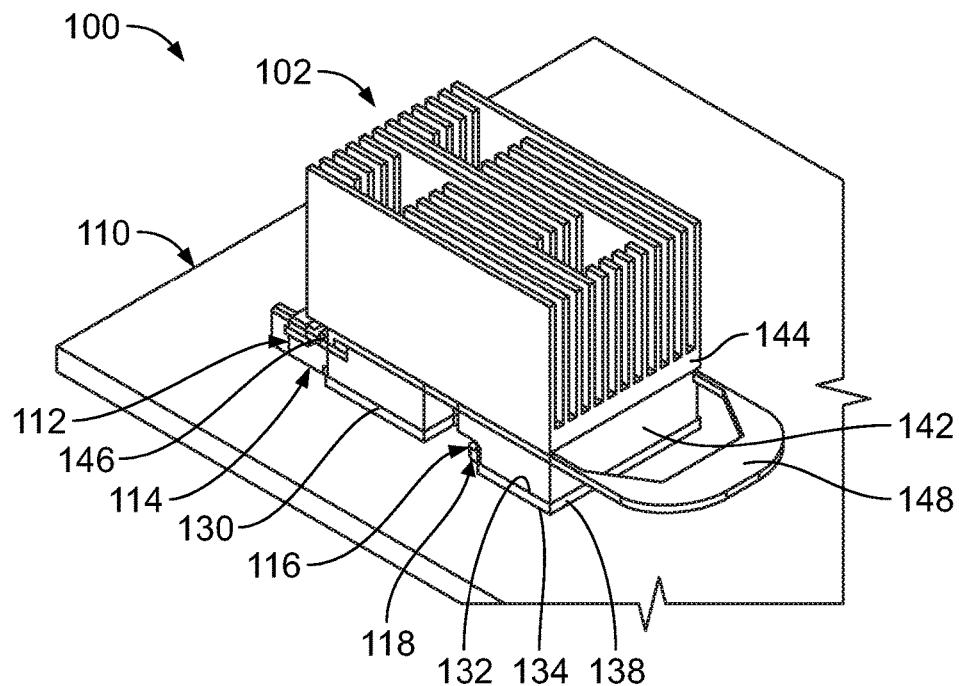
FIG. 1 is a perspective view of a dual connector system formed in accordance with an exemplary embodiment showing a dual connector module mounted to a host circuit board.
Figure 2:
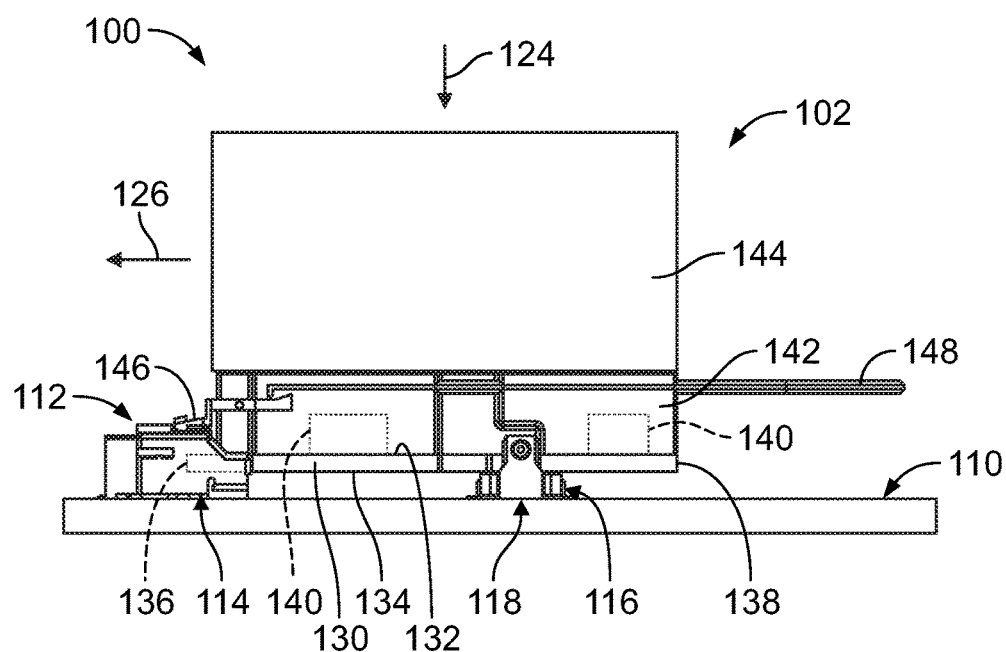
FIG. 2 is a side view of the dual connector system showing the dual connector module mounted to the host circuit board.

FIG. 1 is a perspective view of a dual connector system 100 formed in accordance with an exemplary embodiment showing a dual connector module 102 mounted to a host circuit board 110. FIG. 2 is a side view of the dual connector system 100 showing the dual connector module 102 mounted to the host circuit board 110. The host circuit board 110 has a first electrical connector 112 at a front mounting area 114 of the host circuit board 110 and a second electrical connector 116 at a rear mounting area 118 of the host circuit board 110.

When the dual connector module 102 is mounted to the host circuit board 110, the dual connector module interfaces with both electrical connectors 112, 116. Optionally, the dual connector module 102 may be simultaneously mated with the first and second electrical connectors 112, 116 during a mating process. In an exemplary embodiment, the first electrical connector 112 is a different type of electrical connector than the second electrical connector 116. For example, the first electrical connector 112 may be a front loaded electrical connector, such as a card edge connector. The second electrical connector 116 may be a top loaded electrical connector, such as a mezzanine connector. The electrical connectors 112, 116 may be used for different types of signaling. For example, the first electrical connector 112 may be used for high-speed signaling while the second electrical connector 116 may be used for low speed signaling, powering, or for another type of connection.

In an exemplary embodiment, mating of the dual connector module 102 to the host circuit board 110 occurs by loading the dual connector module 102 in a loading direction 124 (for example, downward) to a pre-staged position and then mating the dual connector module 102 in a mating direction 126 (for example, forward) to a mated position. The loading direction 124 may be perpendicular to the host circuit board 110, such as in a vertical direction, and the mating direction 126 may be parallel to the host circuit board 110, such as in a horizontal direction.

The dual connector module 102 includes a module circuit board 130 having an upper surface 132 and a lower surface 134. The module circuit board 130 extends between a front edge 136 (shown in phantom) and a rear edge 138. The lower surface 134 faces the host circuit board 110 and may be parallel to and spaced apart from the host circuit board 110 when mated to the electrical connectors 112, 116.

In an exemplary embodiment, the dual connector module 102 includes one or more communication components 140 on the upper surface 132 and/or the lower surface 134. The communication components 140 may be electrical components, optical components, or other types of components. In an exemplary embodiment, one or more of the communication components 140 may be on-board optical modules. The communication components 140 may include optical/digital converters for converting between optical and electrical signals. Other types of communication components 140 may be provided on the module circuit board 130, such as processors, memory modules, antennas, or other types of components.

In an exemplary embodiment, the dual connector module 102 includes a housing or shell 142 on the upper surface 132. The shell 142 encloses the communication components 140. In an exemplary embodiment, the shell 142 extends generally around the perimeter of the module circuit board 130; however, portions of the module circuit board 130 may be exposed exterior of the shell 142. In an exemplary embodiment, the dual connector module 102 includes a heat sink 144 thermally coupled to one or more of the communication components 140. The heat sink 144 dissipates heat from the communication components 140. The heat sink 144 may be mounted to the shell 142 and/or the module circuit board 130. In an exemplary embodiment, the heat sink 144 extends substantially the entire length of the dual connector module 102. The heat sink may have a plurality of fins having a large surface area for dissipating heat.

In an exemplary embodiment, the dual connector module 102 includes a latch 146 at a front end of the dual connector module 102 for latchably securing the dual connector module 102 to the first electrical connector 112. A tether 148 is coupled to the latch 146 and extends to the rear end of the dual connector module 102 for releasing the latch 146.

Figure 3:
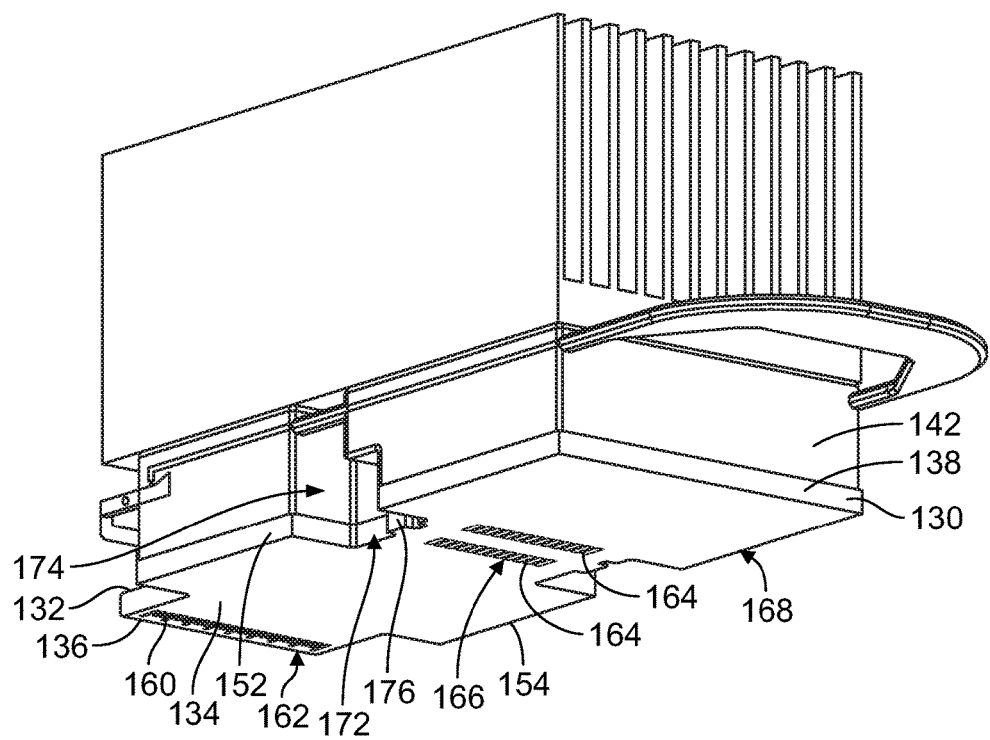
FIG. 3 is a bottom perspective view of the dual connector module in accordance with an exemplary embodiment.

FIG. 3 is a bottom perspective view of the dual connector module 102 in accordance with an exemplary embodiment. In an exemplary embodiment, the module circuit board 130 includes front contact pads 160 proximate to the front edge 136 along the lower surface 134 and/or the upper surface 132. The front contact pads 160 define a first connector interface 162 configured for electrically connecting to the first electrical connector 112 (shown in FIG. 2). For example, the first connector interface 162 may be a card edge interface at the front edge 136 configured to be plugged into a card slot of the first electrical connector 112. The front contact pads 160 are circuits of the module circuit board 130. The front contact pads 160 may be electrically connected to corresponding communication components 140 (shown in FIG. 2) via traces on various layers of the module circuit board 130. In an exemplary embodiment, the front contact pads 160 convey high speed data signals. Optionally, various front contact pads 160 may be arranged in pairs configured to carry differential signals.

The module circuit board 130 includes rear contact pads 164 on the lower surface 134 that define a second connector interface 166 configured for electrically connecting to the second electrical connector 116 (shown in FIG. 2). The rear contact pads 164 may be electrically connected to corresponding communication components 140 via traces on various layers of the module circuit board 130. Optionally, at least some of the rear contact pads 164 may be power pads configured to transmit power between the second electrical connector 116 and the module circuit board 130 for powering the communication components 140. Optionally, the rear contact pads 164 may be provided in multiple rows along the lower surface 134. The rear contact pads 164 are provided at an intermediate portion 168 of the module circuit board 130 remote from the front edge 136 and remote from the rear edge 138. Optionally, the rear contact pads 164 are positioned closer to the rear edge 138 than the front edge 136.

The module circuit board 130 includes cutouts 172 at the first and second side edges 152, 154 near the intermediate portion 168. The shell 142 includes pockets 174 above the cutouts 172. The cutouts 172 and the pockets 174 are configured to receive portions of the second electrical connector 116 during mating of the dual connector module 102 to the second electrical connector 116 (FIG. 2). In an exemplary embodiment, the module circuit board 130 includes landing pads 176 extending into the cutouts 172. The landing pads 176 are configured to be engaged by the second electrical connector 116 to mechanically secure the dual connector module 102 to the second electrical connector 116.

Figure 4:
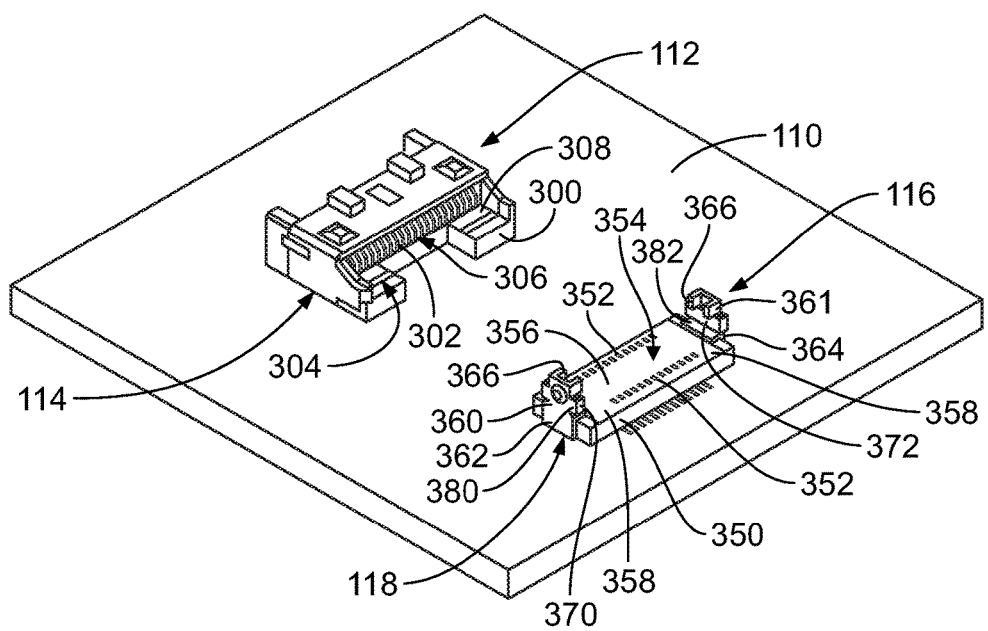
FIG. 4 is a top perspective view of the host circuit board in accordance with an exemplary embodiment.

FIG. 4 is a top perspective view of the host circuit board 110 in accordance with an exemplary embodiment. The host circuit board 110 includes mounting areas for mounting the dual connector module 102 (shown in FIG. 3) to the host circuit board 110. The mounting area is subdivided into the front mounting area 114 receiving the first electrical connector 112 and the rear mounting area 118 receiving the second electrical connector 116

With additional reference to FIG. 3 for reference to components of the dual pluggable module 102, the first electrical connector 112 includes a housing 300 mounted to the host circuit board 110. The housing 300 holds a plurality of first contacts 302 configured to be terminated to the host circuit board 110. The housing 300 has a mating end 304 configured to be mated with the first connector interface 162 (FIG. 3) of the dual connector module 102. In an exemplary embodiment, the first electrical connector 112 includes a card slot 306 at the mating end 304. The first contacts 302 are arranged in the card slot 306 for mating with the first connector interface 162. For example, the first contacts 302 may be arranged in an upper row and a lower row for interfacing with the front contact pads 160 (FIG. 3) on the upper surface 132 and the lower surface 134 at the front edge 136 of the module circuit board 130.

The housing 300 includes locating surfaces 308 at the mating end 304 for locating the module circuit board 130 relative to the card slot 306 during mating. For example, the locating surfaces 308 may be upward facing surfaces configured to support the front edge 136 of the module circuit board 130 in the pre-staged position. The module circuit board 130 may slide along the locating surfaces 308 during mating as the front edge 136 of the module circuit board 130 is loaded into the card slot 306. The locating surfaces 308 may support the module circuit board 130 in the mated position to prevent damage to the first contacts 302 from the weight of the dual connector module 102.

Figure 5:
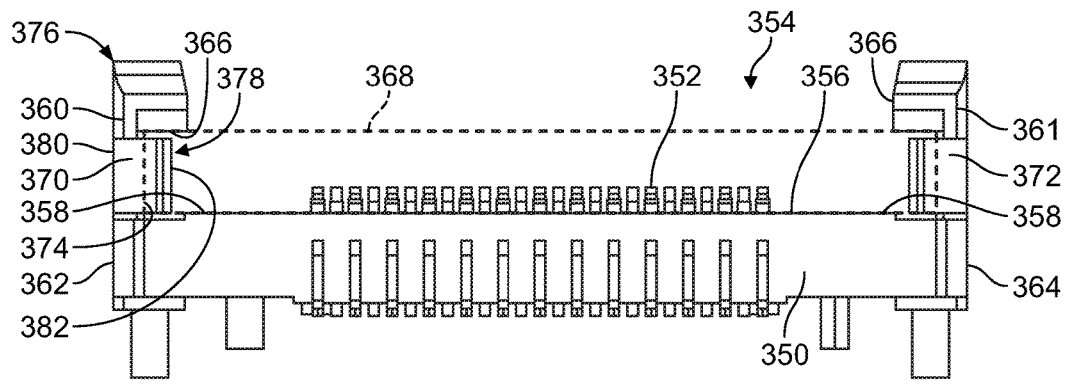
FIG. 5 is an end view of a second electrical connector of the host circuit board in accordance with an exemplary embodiment.

With additional reference to FIG. 5, which is an end view of the second electrical connector 116 in accordance with an exemplary embodiment, the second electrical connector 116 includes a housing 350 mounted to the host circuit board 110. The housing 350 holds a plurality of second contacts 352 configured to be terminated to the host circuit board 110. The housing 350 has a mating end 354 (for example, defining the top) configured to be mated with the second connector interface 166 (FIG. 3) of the dual connector module 102. In an exemplary embodiment, the second electrical connector 116 includes an upper mating surface 356 at the mating end 354. The second contacts 352 are arranged along the upper mating surface 356, such as in one or more rows, for mating with the second connector interface 166. The second contacts 352 may include deflectable spring beams configured to be resiliently biased against the second connector interface 166 when the dual connector module 102 is mated to the second electrical connector 116.

The housing 350 includes locating surfaces 358 at the mating end 354 for locating the module circuit board 130 during mating. For example, the locating surfaces 358 may be upward facing surfaces configured to support the intermediate portion 168 of the module circuit board 130. The housing 350 includes first and second towers 360, 361 extending above the locating surfaces 358, such as at opposite sides 362, 364 of the housing 350. The towers 360, 361 may be integral with the base of the housing 350; however, the towers 360, 361 may be separate components mounted to the base of the housing 350 in alternative embodiments. For example, the towers 360, 361 may be die cast metal components attached to a molded plastic base of the housing 350 to provide additional rigidity for support and holding strength for the module circuit board 130 and/or to provide higher precision manufacturing and locating for the module circuit board 130.

The towers 360, 361 include ledges 366, such as at distal or top ends of the towers 360, 361, extending over the second electrical connector 116. The towers 360, 361 and the ledges 366 define a gap 368 above the upper mating surface 356. The gap 368 receives the module circuit board 130. The ledges 366 are configured to engage the upper surface 132 of the module circuit board 130, such as at the landing pads 176 (FIG. 3), to retain the module circuit board 130 in the gap 368 between the ledges 366 and the upper mating surface 356. The ledges 366 prevent lift-off of the module circuit board 130 when the dual connector module 102 is in the mated position. The module circuit board 130 is configured to bypass the towers 360, 361 as the dual connector module 102 is loaded to the pre-staged position; however, when the dual connector module 102 is slid forward to the mated position, the module circuit board 130 is slid under the ledges 366 to the mated position.

The module circuit board 130 may slide along the locating surfaces 358 during mating as the front edge 136 of the module circuit board 130 is loaded into the card slot 306. The locating surfaces 358 may support the module circuit board 130, such as at the intermediate portion 168, in the mated position to prevent damage to the second contacts 352 from the weight of the dual connector module 102.

In an exemplary embodiment, the second electrical connector 116 includes a first biasing member 370 and a second biasing member 372. The first biasing member 370 is attached to the first tower 360 in the gap 368, such as below the ledge 366 of the first tower 360. The second biasing member 372 is attached to the second tower 361 in the gap 368, such as below the ledge 366 of the second tower 361. The towers 360, 361 and the ledges 366 form hooks 376 defining hook spaces 378 above the upper mating surface 356. The hook spaces 378 are provided at the opposite sides of the gap 368. The first and second biasing members 370, 372 are positioned in the hook spaces 378. The first and second biasing members 370, 372 are provided on opposite sides of the gap 368, such as in the hook spaces 378. The first and second biasing members 370, 372 are provided interior of inner surfaces 374 of the towers 360, 361 and face each other across the gap 368 to engage the module circuit board 130 when the module circuit board 130 is coupled to the second electrical connector 116.

In an exemplary embodiment, the first and second biasing members 370, 372 each include a base 380 and a spring beam 382 extending from the base 380. The first and second biasing members 370, 372 may be stamped and formed from sheet metal into a spring shape, such as a leaf spring shape. The base 380 is coupled to the tower 360 or 361, such as at the inner surface 374 and the spring beams 382 extend into the gap 368. The spring beams 382 are deflectable, such as compressible against the sides of the module circuit board 130, when the module circuit board 130 is coupled to the second electrical connector 116. When the spring beams 382 are compressed, the spring beams 382 are resiliently deformed and are thus spring biased outward against the module circuit board 130 to position the module circuit board 130 between the first and second biasing members 370, 372, and thus between the first and second towers 360, 361.

Figure 6:
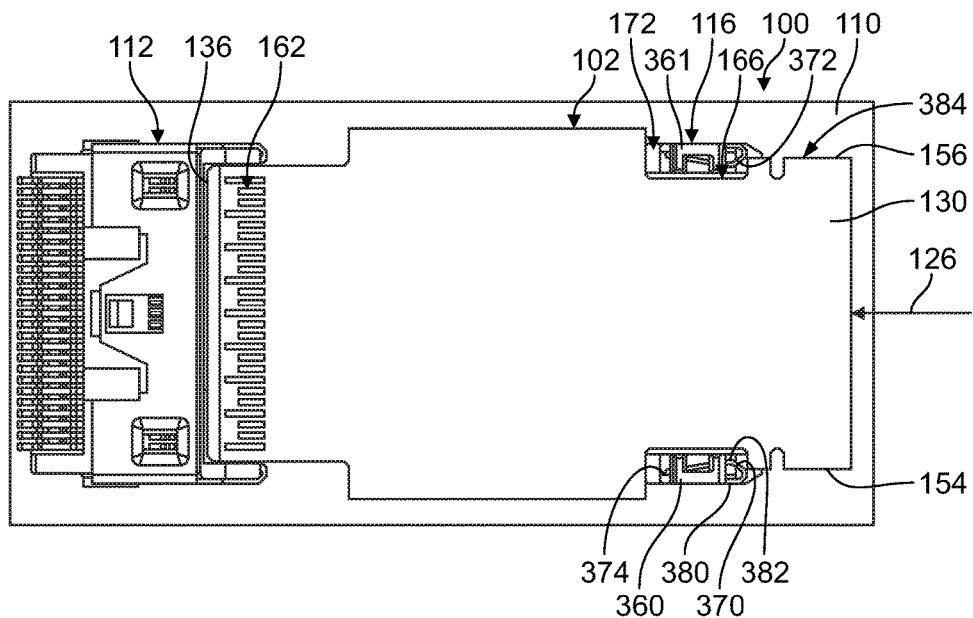
FIG. 6 is a top view of a portion of the dual connector system showing a module circuit board partially mated to the host circuit board.
Figure 7:
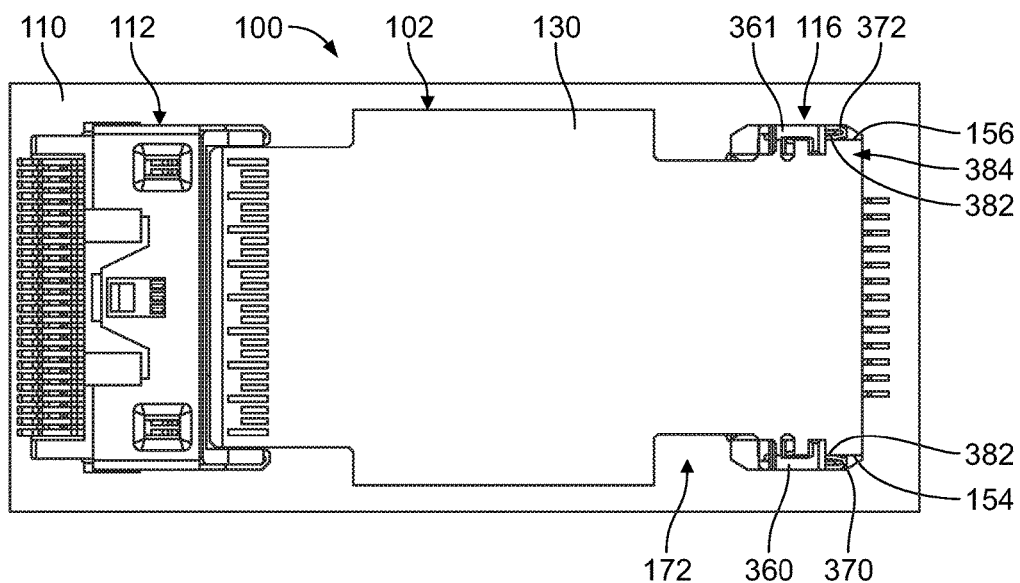
FIG. 7 is a top view of a portion of the dual connector system showing the module circuit board fully mated to the host circuit board.

FIG. 6 is a top view of a portion of the dual connector system 100 showing the module circuit board 130 partially mated to the host circuit board 110. FIG. 7 is a top view of a portion of the dual connector system 100 showing the module circuit board 130 fully mated to the host circuit board 110. The first and second biasing members 370, 372 extend from the first and second towers 360, 361 for locating the module circuit board 130. The bases 380 of the biasing members 370, 372 may be provided at exterior surfaces of the towers 360, 361 and the spring beams 382 may wrap around the towers 360, 361 to the inner surfaces 374 of the towers 360, 361.

In an exemplary embodiment, mating of the dual connector module 102 to the host circuit board 110 occurs by loading the dual connector module 102 in the loading direction 124 (shown in FIG. 2) to the pre-staged position (FIG. 6), such as by loading the dual connector module 102 downward onto the first and second electrical connectors 112, 116. Once positioned, the dual connector module 102 is mated to the first and second electrical connectors 112, 116 by moving the dual connector module 102 in the mating direction 126 to the mated position (FIG. 7).

During mating, the first connector interface 162 is generally aligned above the first electrical connector 112 and the second connector interface 166 is generally aligned above the second electrical connector 116 and the module circuit board 130 is lowered into position on the first and second electrical connectors 112, 116 to the pre-staged position. The front edge 136 of the module circuit board 130 rests on, and is supported by, the first electrical connector 112 in the pre-staged position (FIG. 6).

As the module circuit board 130 is lowered, the towers 360, 361 of the second electrical connector 116 extend into the cutouts 172 in the module circuit board 130. The biasing members 370, 372 are received in the cutouts 172 at opposite sides of the module circuit board 130. For example, a width of the module circuit board 130 at the cutouts 172 is less than a separation distance between the spring beams 382 of the biasing members 370, 372. As such, the module circuit board 130 is able to pass freely into position between the towers 360, 361 and the biasing members 370, 372.

As the dual connector module 102 is moved from the pre-staged position (FIG. 6) to the mated position (FIG. 7), a tail 384 of the module circuit board 130 rearward of the cutouts 172 is moved forward between the towers 360, 361. The biasing members 370, 372 engage the side edges 154, 156 of the module circuit board 130 at the tail 384. The spring beams 382 are deflected and compressed by the side edges 154, 156. The spring beams 382 press outward against the tail 384 to position the module circuit board 130 between the towers 360, 361. For example, the spring beams 382 may substantially center the tail 384. By centering the tail 384, the front edge 136 of the module circuit board 130 is aligned with the first electrical connector 112 such that the module circuit board 130 may be loaded straight into the first electrical connector 112. The spring beams 382 hold the side-to-side position of the module circuit board 130 as the module circuit board 130 is moved between the pre-staged position and the mated position.

Figure 8:
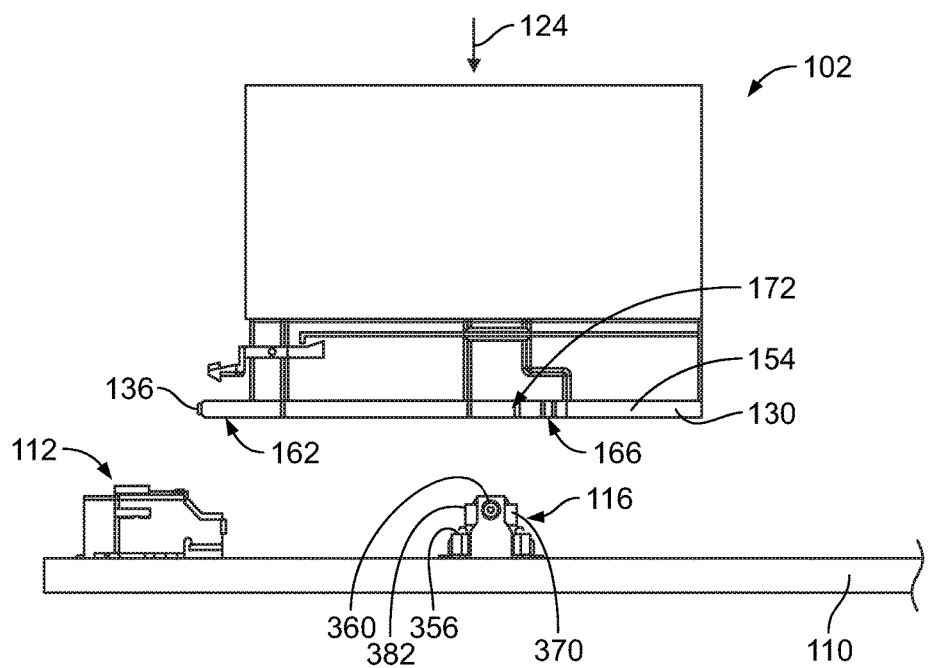
FIG. 8 shows the dual connector module 102 poised for coupling to the host circuit board at an elevated positioned above the host circuit board.
Figure 9:
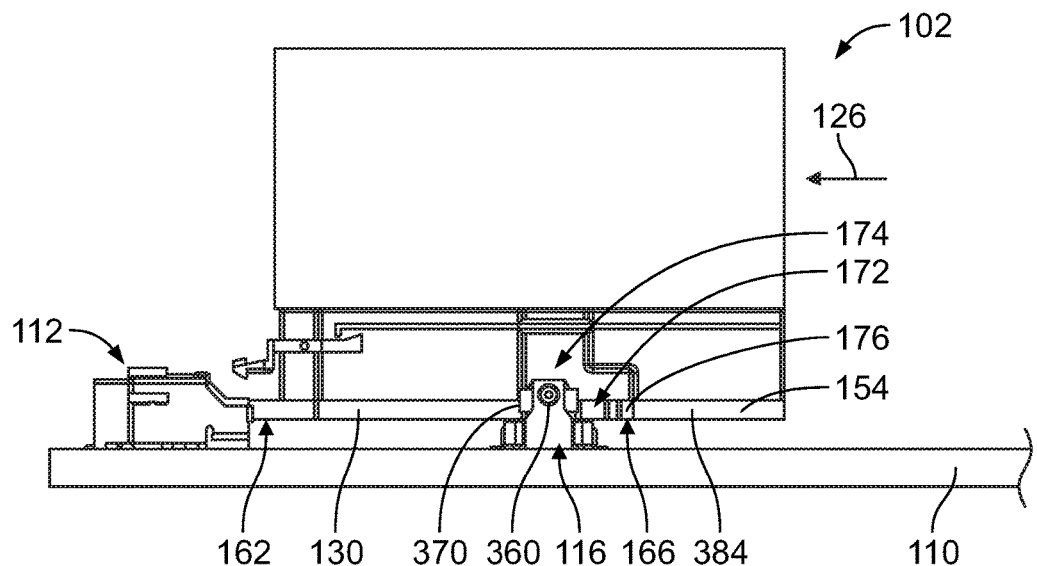
FIG. 9 shows the dual connector module in a pre-staged position on the host circuit board.
Figure 10:
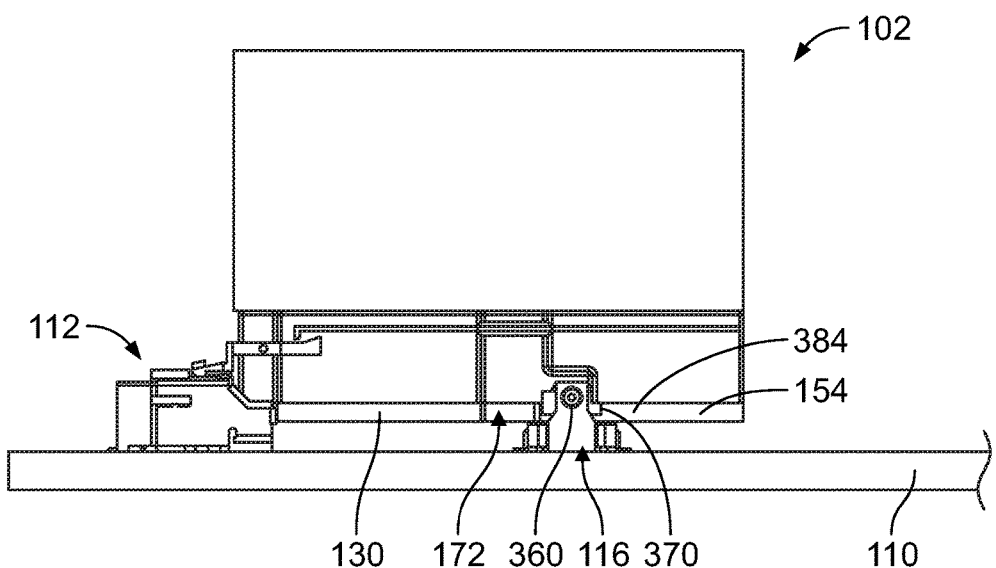
FIG. 10 shows the dual connector module in a mated position on the host circuit board.

FIGS. 8 through 10 show a mating sequence of the dual connector module 102 to the host circuit board 110. FIG. 8 shows the dual connector module 102 poised for coupling to the host circuit board 110 at an elevated positioned above the host circuit board 110. FIG. 9 shows the dual connector module 102 in a pre-staged position. FIG. 10 shows the dual connector module 102 in a mated position.

In an exemplary embodiment, mating of the dual connector module 102 to the host circuit board 110 occurs by loading the dual connector module 102 in the loading direction 124 to the pre-staged position (FIG. 9), such as by loading the dual connector module 102 downward onto the first and second electrical connectors 112, 116. Once positioned, the dual connector module 102 is mated to the first and second electrical connectors 112, 116 by moving the dual connector module 102 in the mating direction 126 to the mated position (FIG. 10).

During mating, the first connector interface 162 is generally aligned above the first electrical connector 112 and the second connector interface 166 is generally aligned above the second electrical connector 116 (FIG. 8) and the module circuit board 130 is lowered into position on the first and second electrical connectors 112, 116 to the pre-staged position (FIG. 9). The front edge 136 of the module circuit board 130 rests on, and is supported by, the first electrical connector 112 in the pre-staged position. As the module circuit board 130 is lowered, the tower 360 of the second electrical connector 116 extends into the cutout 172 in the module circuit board 130. The biasing member 370 is received in the cutout 172.

As the dual connector module 102 is moved from the pre-staged position (FIG. 9) to the mated position (FIG. 10), the tail 384 of the module circuit board 130 rearward of the cutouts 172 is moved forward in line with the tower 360. For example, the module circuit board 130 is slid forward relative to the second electrical connector 116. The biasing member 370 engages the side edge 154 of the module circuit board 130 at the tail 384. The spring beam 382 is deflected and compressed against the side edge 154. In the mated position, the ledge 366 of the tower 360 is positioned above the landing pad 176 of the module circuit board 130 to hold the vertical position of the module circuit board 130 within the second electrical connector 116. For example, the module circuit board 130 is captured between the ledge 366 and the upper mating surface 356. The ledge 366 prevents lift-off of the module circuit board 130 from the upper mating surface 356.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A dual connector system comprising:
a host circuit board having a front mounting area and a rear mounting area;
a first electrical connector at the front mounting area of the host circuit board, the first electrical connector having a first housing having a card slot configured to receive a front edge of a module circuit board, the first housing holding first contacts at the card slot configured to be electrically connected to contact pads at the front edge of the module circuit board, the first contacts being terminated to the host circuit board; and
a second electrical connector at the rear mounting area of the host circuit board, the second electrical connector having a second housing having an upper mating surface configured to receive the module circuit board when mounted thereto, the second housing having rigid towers extending above the upper mating surface at opposite sides of the second housing, the towers having inner surfaces above the upper mating surface, the towers having ledges spaced apart from the upper mating surface above the upper mating surface each having a ledge surface facing the upper mating surface such that a gap is defined between the upper mating surface and the ledge surfaces of the corresponding ledges, the gap being located between the inner surfaces of the towers below the ledge surfaces and above the upper mating surface, the gap receiving the module circuit board such that the ledge surfaces are above the module circuit board to hold a vertical position of the module circuit board in the gap, the second housing having biasing members at each tower interior of the inner surfaces of the towers between the ledge surfaces of the corresponding ledges and the upper mating surface, the biasing members being movable relative to the rigid towers and facing the gap and configured to engage sides of the module circuit board to laterally locate the module circuit board between the towers, the second housing holding second contacts at the upper mating surface configured to be electrically connected to contact pads of the module circuit board, the second contacts being terminated to the host circuit board.

2. The dual connector system of claim 1, wherein the biasing members force the module circuit board away from the towers toward a center of the second housing.

3. The dual connector system of claim 1, wherein the biasing members are configured to engage opposite side edges of the module circuit board proximate to a rear edge of the module circuit board.

4. The dual connector system of claim 1, wherein the biasing members are arranged at opposite sides of the second housing of the second electrical connector.

5. The dual connector system of claim 1, wherein the biasing members are compressible in the gap toward the inner surfaces to press against the sides of the module circuit board.

6. The dual connector system of claim 1, wherein the towers and the ledges form hooks defining hook spaces above the upper mating surface, the biasing members being positioned in the hook spaces.

7. The dual connector system of claim 1, wherein the biasing members impart opposing spring forces on the module circuit board to center the module circuit board between the towers.

8. The dual connector system of claim 1, wherein the second electrical connector is configured to receive the module circuit board in a vertical direction from above the upper mating surface, the second contacts being configured to mate with the module circuit board in a horizontal mating direction as the module circuit board is slid forward.

9. The dual connector system of claim 1, wherein each biasing member includes a base mounted to the tower and a spring beam extending from the base, the spring beam being compressible when engaged with the module circuit board.

10. A dual connector system comprising:
a host circuit board having a front mounting area and a rear mounting area;
a first electrical connector at the front mounting area of the host circuit board, the first electrical connector having a first housing having a card slot, the first housing holding first contacts at the card slot, the first contacts being terminated to the host circuit board;
a second electrical connector at the rear mounting area of the host circuit board, the second electrical connector having a second housing having an upper mating surface, the second housing having a first tower extending above the upper mating surface at a first side of the second housing and a second tower extending above the upper mating surface at a second side of the second housing, the first and second towers having ledges spaced apart from the upper mating surface above the upper mating surface such that a gap is defined between the upper mating surface and the ledges, the ledges located above the gap and facing the upper mating surface across the gap to hold a vertical position of the module circuit board when received in the gap, the second housing having a first biasing member at the first tower between the ledge and the upper mating surface, the first biasing member facing the gap, and the second housing having a second biasing member at the second tower between the ledge and the upper mating surface, the second biasing member facing the gap, the second housing holding second contacts at the upper mating surface, the second contacts being terminated to the host circuit board; and a dual connector module mated to the first and second electrical connectors, the dual connector module having a module circuit board including an upper surface and a lower surface facing the host circuit board, the module circuit board having at least one communication component on the upper surface, the module circuit board having first and second side edges extending between a front edge and a rear edge, the module circuit board having front contact pads proximate to the front edge for electrically connecting to the first electrical connector, the module circuit board having rear contact pads remote from the front edge for electrically connecting to the second electrical connector;

wherein the module circuit board is received in the gap between the upper mating surface and the ledges such that the first and second side edges engage the first and second biasing members, respectively, the first and second biasing members positioning the module circuit board between the first and second towers.

11. The dual connector system of claim 10, wherein the first biasing member forces the module circuit board away from the first tower and the second biasing member forces the module circuit board away from the second tower.

12. The dual connector system of claim 10, wherein the first and second biasing members are configured to engage the first and second side edges of the module circuit board proximate to a rear edge of the module circuit board.

13. The dual connector system of claim 10, wherein the first and second towers comprise inner surfaces facing the gap, the first and second biasing members located interior of the inner surfaces.

14. The dual connector system of claim 10, wherein the first and second towers and the corresponding ledges form hooks defining hook spaces above the upper mating surface, the first and second biasing members being positioned in the corresponding hook spaces.

15. The dual connector system of claim 10, wherein the first and second biasing members impart opposing spring forces on the module circuit board to center the module circuit board between the first and second towers.

16. The dual connector system of claim 10, wherein the second electrical connector is configured to receive the module circuit board in a vertical direction from above the upper mating surface, the second contacts being configured to mate with the module circuit board in a horizontal mating direction as the module circuit board is slid forward.

17. The dual connector system of claim 10, wherein the first and second biasing member each include a base mounted to the corresponding first and second tower and a spring beam extending from the base, the spring beam being compressible when engaged with the module circuit board.

18. A dual connector system comprising:
a host circuit board having a front mounting area and a rear mounting area;
a first electrical connector at the front mounting area of the host circuit board, the first electrical connector having a first housing having a card slot, the first housing holding first contacts at the card slot, the first contacts being terminated to the host circuit board;
a second electrical connector at the rear mounting area of the host circuit board, the second electrical connector having a second housing having an upper mating surface, the second housing having a first tower extending above the upper mating surface at a first side of the second housing and a second tower extending above the upper mating surface at a second side of the second housing, the first and second towers having ledges spaced apart from the upper mating surface above the upper mating surface such that a gap is defined between the upper mating surface and the ledges, the second housing having a first biasing member at the first tower between the ledge and the upper mating surface facing the gap and a second biasing member at the second tower between the ledge and the upper mating surface facing the gap, the second housing holding second contacts at the upper mating surface, the second contacts being terminated to the host circuit board; and
a dual connector module mated to the first and second electrical connectors, the dual connector module having a module circuit board including an upper surface and a lower surface facing the host circuit board, the module circuit board having at least one communication component on the upper surface, the module circuit board having first and second side edges extending between a front edge and a rear edge, the module circuit board having front contact pads proximate to the front edge defining a first connector interface for electrically connecting to the first electrical connector, the module circuit board having rear contact pads on the lower surface remote from the front edge defining a second connector interface for electrically connecting to the second electrical connector;
wherein the dual connector module is coupled to the host circuit board by lowering the dual connector module in a loading direction generally perpendicular to the host circuit board to a pre-staged position where the first connector interface is adjacent to the first electrical connector and the second connector interface is adjacent to the second electrical connector;
wherein the dual connector module is slid forward from the pre-staged position to a mated position in a mating direction generally parallel to the upper surface of the host circuit board to mate the first connector interface to the first electrical connector by loading the front edge of the module circuit board into the card slot of the first electrical connector to mate the first contacts to the first contact pads and to mate the second connector interface to the second electrical connector to mate the second contacts to the second contact pads;
wherein the module circuit board is received in the gap between the upper mating surface and the ledges in the mated position such that the upper mating surface supports a bottom of the module circuit board and the ledges block a top of the module circuit board to hold a vertical position of the module circuit board in the gap; and
wherein the module circuit board is received in the gap between the upper mating surface and the ledges in the mated position such that the first and second sides engage the first and second biasing members, respectively, the first and second biasing members positioning the module circuit board between the first and second towers.

19. The dual connector system of claim 18, wherein the first biasing member forces the module circuit board away from the first tower and the second biasing member forces the module circuit board away from the second tower.

20. The dual connector system of claim 18, wherein the first and second biasing members impart opposing spring forces on the module circuit board to center the module circuit board between the first and second towers.

* * * * *